United States Patent [19]

Nguyen-Tan Tai

[11] 4,095,189
[45] June 13, 1978

[54] ELECTRONIC POWER AMPLIFIER FOR DELIVERING A CONSTANT POWER INTO A LOAD IMPEDANCE

[76] Inventor: Paul Nguyen-Tan Tai, 56, rue des Pyrenees, 75020 Paris, France

[21] Appl. No.: 766,536

[22] Filed: Feb. 7, 1977

[30] Foreign Application Priority Data

Feb. 9, 1976 France .................................. 76 03500

[51] Int. Cl.$^2$ ............................................. H03F 3/183
[52] U.S. Cl. .................................. 330/265; 330/267; 330/290; 330/293; 330/296
[58] Field of Search ....................... 330/13, 17, 25, 28, 330/32, 40, 207 P; 307/297

[56] References Cited

U.S. PATENT DOCUMENTS 3,500,218  3/1970  Burwen .............................. 330/207 P
3,686,580  8/1972  Van Den Plassche ............. 330/25 X

FOREIGN PATENT DOCUMENTS 1,413,824  11/1975  United Kingdom ............. 330/207 P

*Primary Examiner*—James B. Mullins
*Attorney, Agent, or Firm*—Cameron, Kerkam, Sutton, Stowell & Stowell

[57] ABSTRACT

The amplifier comprises at least two amplifier units or transistors $T_1$ and $T_2$ of complementary types. The base of the first transistor $T_1$ is connected to a control current supply line. The emitter of the transistor $T_1$ is connected on the one hand to one end of the load impedance and on the other hand to the base of the second transistor $T_2$. The collector of the transistor $T_1$ is connected to a voltage supply of suitable polarity. The emitter of the transistor $T_2$ is connected to the current supply line and the collector of said transistor is connected to another end of the load impedance.

6 Claims, 3 Drawing Figures

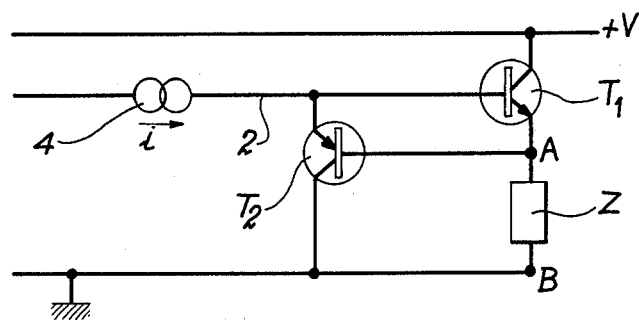
FIG. 1
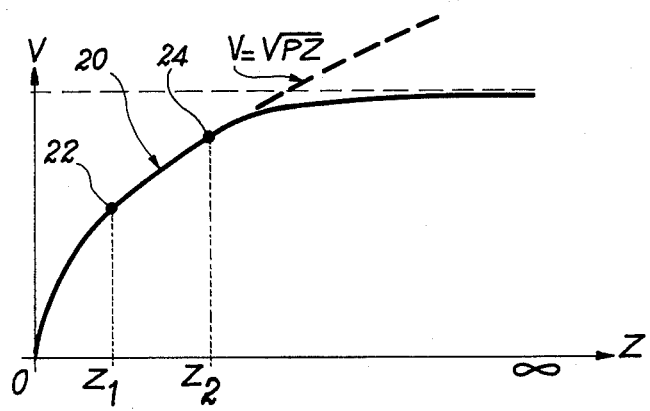
FIG. 3
FIG. 2
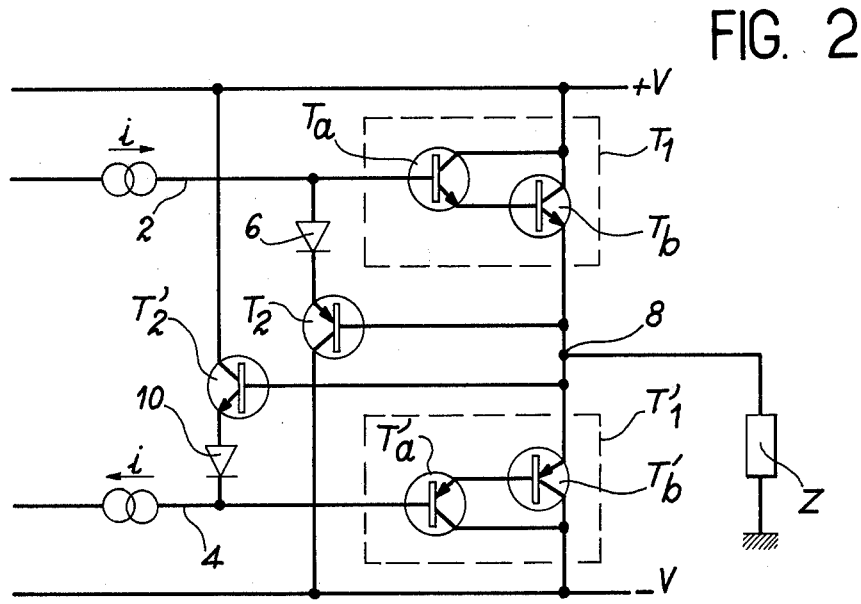

ELECTRONIC POWER AMPLIFIER FOR DELIVERING A CONSTANT POWER INTO A LOAD IMPEDANCE

This invention relates to an electronic power amplifier for delivering a constant power into a load impedance, the value of power being independent of the variations in value of said impedance.

The invention applies to all electronic or electrical devices in which it is intended to deliver a variably controlled and constant power into a load impedance, the value of said impedance being subject to variations which are often difficult to conrol.

The invention applies in particular to the alternating-current or direct-current control of loudspeakers, the amplifier in accordance with the invention being placed before the loudspeaker : the variations in impedance of said loudspeaker as a function of the frequency do not disturb the regulated value of the power which is dissipated in said loudspeaker. The invention is applicable to a loudspeaker of both the capacitive and inductive type.

The invention also applies to the supply of furnace heating resistors : it is known that heating furnaces must be supplied with heat as uniformly as possible in order to ensure that the temperature rise takes place linearly or in a manner which is controlled in accordance with a known function. In fact, the power which is dissipated in a resistor is a function of its value of resistance and this latter varies with the temperature. The electronic amplifier in accordance with the invention makes it possible to dissipate in said resistor a variably controlled power which is independent of the variations of said resistor with temperature.

The invention also applies to the control of microwave-frequency heating furnaces, to the supply of electrolytic electrodes and so forth.

It is known that many regulating devices have been employed for adjusting the power dissipated in an impedance by employing current or voltage-stabilized negative-feedback devices. These devices have the disadvantage of being costly since they usually make use of operational amplifiers and are also unstable or, in other words, operate satisfactorily only within narrow current and voltage limits and under well-defined external conditions of temperature, pressure and so forth. Moreover, operational amplifiers are subject to drift (variations in the offset voltage) which is often incompatible with accurate control.

The electronic power amplifier in accordance with the invention is of very simple and therefore economical design and offers a high degree of reliability by virtue of its simplicity of construction in which the number of failures is reduced by the small number of electronic components employed.

The electronic power amplifier in accordance with the invention delivers into a load impedance a constant power which does not depend on the variations in value of said impedance; the power level is controlled by the value of an input current obtained by an adjustable current source which does not form part of the electronic amplifier device in accordance with the invention. The amplifier in accordance with the invention comprises at least two transistors or two amplifier units designated by the references $T_1$ and $T_2$. In the case of two transistors, the transistors $T_1$ and $T_2$ are of complementary types. Thus the base of the first transistor $T_1$ is connected to a current supply line taken from the control current source. The emitter of said transistor is connected on the one hand to one end of the load impedance and on the other hand to the base of the second transistor $T_2$. The collector of said transistor $T_1$ is connected to a voltage supply of suitable polarity. The emitter of the transistor $T_2$ is connected to the current supply line and the collector of said transistor is connected to another end of the load impedance.

In an alternative embodiment of the invention, the transistor $T_1$ can be replaced by an amplifier circuit of the Darlington type comprising two transistors in series of the same type. Said Darlington circuit is characterized by a high input impedance.

The circuit in accordance with the invention can be employed in Class A, in which case a single set of transistors $T_1 - T_2$ is necessary, or in Class B, in which case a suitably polarized circuit $T_1$ and $T_2$ is necessary for each half-wave.

In the example of construction given herein, the transistor $T_1$ is an n-p-n transistor and the transistor $T_2$ is a p-n-p transistor but it is readily apparent that the reverse configuration can be employed if the two transistors $T_1$ and $T_2$ are intended to be of a different type.

Further objects and advantages of the invention will become more readily apparent from the following description of examples which are given by way of explanation and not in any limiting sense, reference being made to the accompanying drawings, wherein:

FIG. 1 is a preferential form of construction of the two-transistor amplifier in accordance with the invention;

FIG. 2 shows one example of a Class B circuit arrangement of the power amplifier in accordance with one embodiment of the invention;

FIG. 3 is a curve showing the constancy of the power delivered by the electronic amplifier in accordance with the invention.

In FIG. 1, there is shown one embodiment of the device in accordance with the invention comprising two transistors $T_1$ and $T_2$, the base of the transistor $T_1$ being connected to the current source 4 by the current supply line 2. The collector of the transistor $T_1$ is connected to the supply +V and the emitter of said transistor is connected to the terminal A, namely to the end of the load impedance Z. The emitter of the transistor $T_1$ is also connected to the base of the transistor $T_2$, the collector of the transistor $T_2$ being connected to the terminal B of the load impedance Z. The emitter of the transistor $T_2$ (of p-n-p type whereas the transistor $T_1$ is of the n-p-n type) is connected to the voltage supply line 2. In one embodiment of the amplifier in accordance with the invention, the transistor $T_1$ and $T_2$ are transistors of the type known as Sescosem 2N3055 ($T_1$) and 2N2905 ($T_2$). The current control device for delivering the current I which determines the power level dissipated in the impedance Z is a current control device of conventional type such as a transistor, namely a p-n-p transistor in this case which is mounted with a common-base connection (not shown). The principle of operation of the device is based on the properties of base-emitter junctions of the bipolar transistors $T_1$ and $T_2$. This can be understood from the following remarks : if the impedance Z decreases, the voltage at the terminal A of said impedance with respect to ground (terminal B) decreases. The base-emitter voltage of the transistor $T_2$ therefore increases and the same consequently applies to the base-emitter voltage of the transistor $T_1$. As a further consequence, a higher current is then delivered to the base of transistor $T_1$, with the result that this latter delivers a higher current into the impedance Z. Thus, as explained earlier, any variation of the impedance Z results in a variation of voltage on the base of the transistor $T_2$ which causes a variation of current distribution between the transistor $T_1$ and the transistor $T_2$. This has the effect of increasing the current in the impedance Z so that the power should remain constant; this power is equal to the product of the voltage and of the current intensity. The value of the power level is adjusted by means of the current $i$ delivered by the source 4. In order to reduce the voltage increase imposed by the transistor $T_1$ to zero, it is an advantage in some cases to add a resistor, a capacitor or a diode between the emitter of the transistor $T_2$ and the current supply line 2.

The device shown in FIG. 1 makes it possible to dissipate about 20 watts in the impedance Z 20 varies between 2 and 150 ohms.

In FIG. 2, there is shown another embodiment of the invention in which the amplifier operates in Class B. This means that, in the case of one half-wave, the current is supplied from the source along channel 2 and in the case of the other half-wave (current of opposite sign), it is supplied through channel 4. In this case, the load impedance Z is placed between ground and a midpoint 8 between the two direct-current voltage supplies $+V$ and $-V$. The amplifier circuit $T_1$ is constituted by two transistors $T_a$ and $T_b$ mounted as a Darlington circuit, this type of circuit being conventional and well known to anyone versed in the art. The emitter of the last transistor $T_b$ is connected to the base of the transistor $T_2$ while the emitter of the transistor $T_2$ is connected through the diode 6 to the current supply line 2. Similarly, the current supply line 4 is connected to the base of the transistor $T'_a$ of the Darlington circuit $T'_1$ which is symmetrical with $T_1$ and again makes use of the transistors $T'_a$ and $T'_b$. The emitter of the transistor $T'_a$ is connected to the base of the transistor $T'_2$, the emitter of which is connected to the current supply line 4 through the diode 10. In this case, the diodes 6 and 10 are intended to compensate for the increase in base-emitter voltage produced by the two transistors of the Darlington circuit.

It is readily apparent that other circuit arrangements which introduce transistors such as $T_1$ and $T_2$ comprising amplifiers or intermediate impedance-matching devices are included within the scope of the invention which consists in effecting a current distribution between two transistors, this current distribution being "self-regulating" as a function of the variations in value of the impedance connected between two terminals. This regulation is as shown in FIG. 1. Control of power is carried out by means of a current supply applied to the base of a first transistor $T_1$ and the emitter of th second transistor $T_2$.

The variations in voltage at the terminals of the load impedance, in this case a resistor Z for example, are shown as a function of said impedance on curve 20 of FIG. 3. The voltages V at the terminals of said resistor are given as a function of the impedance by the formula $V = \sqrt{PZ}$. It has been established on curve 20 that, at a given control intensity, the curve did not depend on the impedance Z or in other words that it corresponds to a single power parameter T. In fact, in the case of two values $Z_1$ and $Z_2$ of the resistor, the voltage (points 22 and 24) is given by the formulae $V_1 = \sqrt{PZ_1}$ and $V_2 = \sqrt{PZ_2}$ whilst the ratio $V^2/Z$ remains constant.

We claim:

1. An electronic power amplifier for delivering into a load impedance a constant power which does not depend on variations in the value of said impedance, the level of said power being controlled by the value of an input current, wherein said amplifier comprises at least two transistors $T_1$ and $T_2$ of complementary type, the base of the first transistor $T_1$ being connected to a line for the supply of current delivered by a control current source, the emitter of said transistor $T_1$ being connected on the one hand to one end of the load impedance and on the other hand connected directly to the base of the second transistor $T_2$, the collector of said transistor $T_1$ being connected to a voltage supply of suitable polarity, the emitter of said transistor $T_2$ being connected to the current supply line and the collector of said transistor $T_2$ being connected to another end of the load impedance.

2. An electronic amplifier according to claim 1, wherein said amplifier comprises a push-pull arrangement of two amplifier units formed by the connections of transistors $T_1$ and $T_2$ in which the amplifiers accordingly operate in the Class B mode.

3. An electronic amplifier according to claim 1, wherein said amplifier further comprises a diode connected between the input of the emitter of the transistor $T_2$ and the current supply line from the current source.

4. An electronic power amplifier for delivering into a load impedance a constant power which does not depend on variations in the value of said impedance, the level of said power being controlled by the value of an input current, wherein said amplifier comprises at least a circuit of a predetermined conduction type, one amplifier circuit $T_1$ of the Darlington type and a transistor $T_2$, said Darlington circuit $T_1$ and said transistor $T_2$ being of complementary conduction type, said transistor circuit $T_1$ comprising two transistors in series of the same type including a first transistor $T_a$ in which the base is connected by a line to a current supply source and the emitter is connected to the base of a second transistor $T_b$, the collector of said transistor $T_a$ and of said transistor $T_b$ being connected to a current supply source, the emitter of said transistor $T_b$ being connected directly to the base of said transistor $T_2$ and the base said transistor $T_2$ being connected to the load impedance.

5. An electronic amplifier according to claim 4, wherein said amplifier further comprises one other circuit of conduction type opposed to said predetermined conduction type, whereby said circuit of predetermined conduction type and said circuit of opposed conduction type operate in the class B mode.

6. An electronic amplifier according to claim 4, wherein said amplifier further comprises a diode connected between the input of the emitter of the transistor $T_2$ and the current supply line from the current source.

* * * * *